United States Patent
Yoshimi et al.

(10) Patent No.: US 7,238,545 B2
(45) Date of Patent: Jul. 3, 2007

(54) METHOD FOR FABRICATING TANDEM THIN FILM PHOTOELECTRIC CONVERTER

(75) Inventors: Masashi Yoshimi, Kobe (JP); Takashi Suezaki, Otsu (JP); Kenji Yamamoto, Kobe (JP)

(73) Assignee: Kaneka Corporation, Osaka (JP)

( * ) Notice: Subject to any disclaimer, the term of this patent is extended or adjusted under 35 U.S.C. 154(b) by 0 days.

(21) Appl. No.: 10/508,044

(22) PCT Filed: Apr. 2, 2003

(86) PCT No.: PCT/JP03/04245

§ 371 (c)(1),
(2), (4) Date: Sep. 17, 2004

(87) PCT Pub. No.: WO03/085746

PCT Pub. Date: Oct. 16, 2003

(65) Prior Publication Data

US 2005/0181534 A1 Aug. 18, 2005

(30) Foreign Application Priority Data

Apr. 9, 2002 (JP) .............................. 2002-107133

(51) Int. Cl.
*H01L 21/00* (2006.01)

(52) U.S. Cl. .......................................... 438/74; 438/93

(58) Field of Classification Search ................ 438/57, 438/74, 98, 510, 513–516, 518–521, 485–489, 438/94, 93; 257/E31.053, E31.055, E31.057, 257/E31.064
See application file for complete search history.

(56) References Cited

U.S. PATENT DOCUMENTS

| 5,246,506 | A |   | 9/1993 | Arya et al. |
| 5,635,408 | A | * | 6/1997 | Sano et al. ................ 438/58 |
| 6,303,945 | B1 | * | 10/2001 | Saito et al. ................ 257/64 |
| 6,399,873 | B1 | * | 6/2002 | Sano et al. ................ 136/249 |
| 2001/0023971 | A1 | * | 9/2001 | Kondo et al. ................ 257/458 |

FOREIGN PATENT DOCUMENTS

| JP | 61-008979 | 1/1986 |
| JP | 63-127584 | 5/1988 |
| JP | 07-0150025 | 1/1995 |
| JP | 07-297431 | 11/1995 |
| JP | 09-027627 | 1/1997 |
| JP | 2000-164904 | 6/2000 |
| JP | 2001-189474 | 7/2001 |
| JP | 2002-237609 | 8/2002 |

* cited by examiner

*Primary Examiner*—Brook Kebede
(74) *Attorney, Agent, or Firm*—Hogan & Hartson LLP

(57) ABSTRACT

A method of manufacturing a tandem-type thin film photoelectric conversion device includes the steps of forming at least one photoelectric conversion unit (3) on a substrate (1) in a deposition apparatus, taking out the substrate (1) having the photoelectric conversion unit (3) from the deposition apparatus to the air, introducing the substrate (1) into a deposition apparatus and carrying out plasma exposure processing on the substrate (1) in an atmosphere of a gas mixture containing an impurity for determining the conductivity type of the same conductivity type as that of the uppermost conductivity type layer (33) and hydrogen, forming a conductivity type intermediate layer (5) by additionally supplying semiconductor raw gas to the deposition apparatus, and then forming a subsequent photoelectric conversion unit (4).

4 Claims, 4 Drawing Sheets

METHOD FOR FABRICATING TANDEM THIN FILM PHOTOELECTRIC CONVERTER

TECHNICAL FIELD

The present invention relates to a method of manufacturing a tandem-type thin film photoelectric conversion device and, more particularly, to a method of manufacturing which can suppress reduction in performance of a photoelectric conversion device, enhance the flexibility of manufacturing steps and improve manufacturing efficiency. In the specification, terms "crystalline" and "microcrystalline" are used also for a state partially including amorphous regions, as generally used in the field of the art.

BACKGROUND ART

In recent years, semiconductor thin film photoelectric conversion devices as represented by a solar cell have been diversified, and crystalline silicon thin film solar cells have been developed in addition to conventional amorphous silicon thin film solar cells. Furthermore, a tandem (hybrid)-type thin film solar cell having a stack thereof have come into practical use.

In general, a silicon thin film photoelectric conversion device includes a first electrode, one or more semiconductor thin film photoelectric conversion units and a second electrode stacked in sequence on a substrate at least a surface portion of which is insulated. Further, one photoelectric conversion unit includes an i-type layer sandwiched between a p-type layer and an n-type layer.

A major portion of the thickness of the thin film photoelectric conversion unit is occupied by the i-type layer of a substantially intrinsic semiconductor layer and photoelectric conversion occurs mainly in the i-type layer. Accordingly, it is preferable that the i-type layer as a photoelectric conversion layer has a greater thickness for the purpose of light absorption, though increase of the thickness increases costs and time for deposition of the i-type layer.

The p-type and n-type conductive layers serve to produce a diffusion potential within the photoelectric conversion unit, and magnitude of the diffusion potential affects the value of open-circuit voltage which is one of important properties of the thin film photoelectric conversion device. However, these conductive layers are inactive layers which do not directly contribute to photoelectric conversion. That is, light absorbed by these inactive layers is a loss, which does not contribute to electric power generation. Consequently, it is preferable to minimize the thickness of the p-type and n-type conductive layers as far as they provide a sufficient diffusion potential.

For this reason, regardless of whether p-type and n-type conductivity type layers included in a photoelectric conversion unit or a photoelectric conversion device is amorphous or crystalline, one whose i-type photoelectric conversion layer which occupies a major portion of the conductivity type layer is amorphous is called an amorphous unit or an amorphous photoelectric conversion device, and one whose i-type layer is crystalline is called a crystalline unit or a crystalline photoelectric conversion device.

Currently, a wide variety of materials and forming technologies have been developed for achieving quality required for conductivity type layers included in a photoelectric conversion device. As a material for a conductivity type layer of a silicon photoelectric conversion device, amorphous silicon or its alloy material or crystalline silicon or its alloy material is generally used. Generally, an amorphous silicon material having a wider band gap than that of a photoelectric conversion layer (i-type layer) or a microcrystalline silicon material having a high impurity activation rate is used for a conductivity type layer, with the intention to attain a high photoelectric conversion characteristic while reducing electric and optical losses as small as possible.

A conductive layer of a silicon photoelectric conversion unit is generally formed by a method substantially the same as that for a photoelectric conversion layer (i-type layer) such as a plasma CVD method. The conductive layer is formed from reaction gas which is a mixture of a raw gas containing atoms of silicon and doping gas containing atoms of a conductivity-type determining impurity. In recent years, a modified process of general plasma CVD method has been attempted in order to form the conductivity type layer.

For example, JP-A-06-232429 discloses a plasma doping method in which an i-type layer is once formed by a plasma CVD method and then plasma processing is carried out in an atmosphere containing a mixture of doping gas and a dilution gas such as hydrogen whereby an area near a surface of the i-type layer is changed to a conductivity type layer. Alternatively, JP-A-10-074969 discloses a method for improving crystallinity of a conductivity type layer in which a conductivity type microcrystalline layer is once formed by a plasma CVD method and then plasma processing is carried out in a hydrogen atmosphere. In both of the methods, film deposition by the plasma CVD method and subsequent plasma processing are carried out as continuous processes in a decompression reaction chamber. Thus, a good junction interface and a high quality conductivity type layer can be formed.

In order to enhance a conversion efficiency of a thin film photoelectric conversion device, it is known that two or more photoelectric conversion units are stacked to form a tandem-type thin film photoelectric conversion device. In this case, a front unit including a photoelectric conversion layer having a large band gap (such as of an amorphous silicon or an Si—C alloy) is disposed closer to the light incident side of the photoelectric conversion device, and a rear unit including a photoelectric conversion layer having a small band gap (such as of an Si—Ge alloy) is disposed behind the front unit in sequence. Thus, photoelectric conversion can be performed over a wide wavelength range of incident light, and the conversion efficiency of the entire photoelectric conversion device can be improved. Among such tandem-type thin film photoelectric conversion devices, one including both of an amorphous photoelectric conversion unit and a crystalline photoelectric conversion unit is occasionally called a hybrid thin film solar cell in particular.

For example, a wavelength of light that can be photoelectrically converted by an i-type amorphous silicon ranges to about 800 nm maximum on the long wavelength side, while an i-type crystalline silicon can photoelectrically convert light having a longer wavelength ranging to about 1100 nm. Here, an amorphous silicon photoelectric conversion layer having large light absorption is enough to light absorption in the thickness of about 0.3 μm or less even in the case of a single layer. However, in order to sufficiently absorb light of a longer wavelength also, a crystalline silicon photoelectric conversion layer having a small light absorption coefficient is preferably about 2 to 3 μm thick or above in the case of a single layer. In other words, a crystalline photoelectric conversion layer generally desirably has a large thickness about ten times of that of an amorphous photoelectric conversion layer.

In the tandem-type thin film photoelectric conversion device, respective photoelectric conversion units are desired to be formed under respective optimum conditions. Therefore, the respective photoelectric conversion units may be formed discontinuously by separate deposition apparatuses. Furthermore, in order to enhance flexibility of manufacturing processes of the tandem-type thin film photoelectric conversion device and to improve production efficiency, the respective photoelectric conversion units may be desired to be formed discontinuously by separate deposition apparatuses.

However, the inventors experienced that, when a first photoelectric conversion unit was formed, then a substrate including the unit was once taken out to the air from a deposition apparatus, and a second photoelectric unit was stacked thereafter, characteristics of the resulting tandem-type thin film photoelectric conversion device deteriorate as compared to that of a tandem-type thin film photoelectric conversion device wherein all units were continuously formed without taking a substrate out to the air.

DISCLOSURE OF THE INVENTION

In view of the circumstances of the conventional arts, the invention is aimed at to minimize the reduction in photoelectric conversion efficiency of a tandem-type thin film photoelectric conversion device due to exposure to the air when a substrate having one or more photoelectric conversion units is once taken out to the air from a deposition apparatus in mid-course of formation of a plurality of the units involved in the photoelectric conversion unit.

A method of manufacturing a tandem-type thin film photoelectric conversion device according to the invention includes the steps of forming at least one photoelectric conversion unit on a substrate in a deposition apparatus, taking out the substrate having the photoelectric conversion unit to the air from the deposition apparatus, introducing the substrate into a deposition apparatus and carrying out plasma exposure processing on the substrate in an atmosphere of a gas mixture containing an impurity element for determining the conductivity type of the same type as that of the uppermost conductivity type layer of the photoelectric conversion unit on the substrate and hydrogen, forming a conductivity type intermediate layer by additionally supplying a semiconductor raw gas to the deposition apparatus, and then forming a subsequent photoelectric conversion unit.

In any photoelectric conversion unit included in the tandem-type thin film photoelectric conversion device, a one-conductivity type layer, a photoelectric conversion layer of substantially intrinsic semiconductor and an opposite-conductivity type layer are stacked in sequence. The tandem-type thin film photoelectric conversion device preferably includes at least one amorphous silicon thin film photoelectric conversion unit and at least one crystalline silicon thin film photoelectric conversion unit.

Preferably, a non-doped intermediate layer having a thickness of 5 nm or less is formed subsequently to the formation of the at least one photoelectric conversion unit on the substrate and the substrate is then taking out to the air.

The plasma exposure processing is preferably carried out for 60 seconds or less using high frequency discharging at a frequency of 13.56 MHz or higher in the mixed atmosphere containing the gas containing the element for determining the conductivity-type in an amount of 20 ppm or more based on the hydrogen. The plasma exposure processing and the formation of the conductivity-type intermediate layer are preferably carried out in the same deposition apparatus and under substantially the same pressure.

BEST MODE FOR CARRYING OUT THE INVENTION

Figure 1:
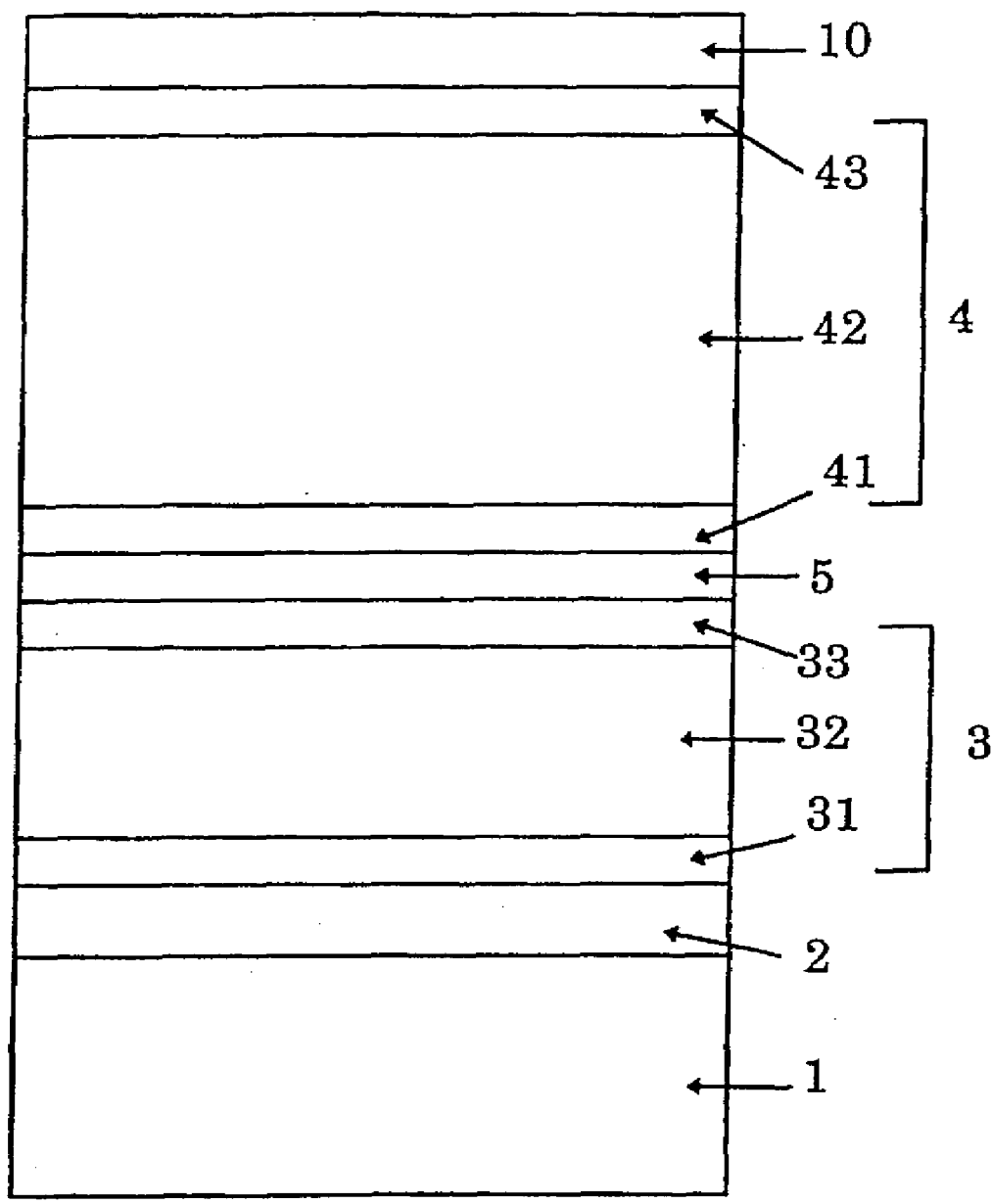
FIG. 1 is a schematic cross section diagram showing a tandem-type thin film photoelectric conversion device manufactured by a method of manufacturing according to an embodiment of the invention.

Preferred embodiments of the invention will be described below with reference to the drawings. In order to clarify and simplify the drawings, dimension relationships of the thickness, the length and the like are modified appropriately in the drawings of this application, and they do not show the actual dimension relationships. In the drawings, the same reference numerals are given to the same components and equivalent parts in the drawings.

FIG. 1 shows a schematic cross section diagram of a silicon tandem-type thin film photoelectric conversion device manufactured by a method according to an embodiment of the invention. Namely, in the photoelectric conversion device, a transparent electrode 2 made of a transparent conductive oxide (TCO) film is formed on a transparent insulative substrate 1 made of glass or the like. On the transparent electrode 2, a one-conductivity type layer 31, a intrinsic semiconductor amorphous or crystalline photoelectric conversion layer 32 and an opposite-conductivity type layer 33 included in a first photoelectric conversion unit 3 are deposited in sequence preferably by plasma CVD (or they may be deposited by other chemical vapor deposition as a matter of course). Preferably, a P-type layer 31, a substantially intrinsic semiconductor photoelectric conversion layer 32 and an n-type layer 33 are deposited in this order.

After the first photoelectric conversion unit 3 is formed, the substrate 1 is taken out from a plasma CVD apparatus to the air whereby, the surface of the opposite-conductivity type layer 33 is exposed to the air. Then, the substrate 1 is introduced into another plasma CVD apparatus and undergoes plasma exposure processing in a mixed atmosphere of doping gas containing an element for determining the conductivity type of the same type as that of the opposite-conductivity type layer 33 (such as phosphine) and hydrogen. As the doping gas, gas containing phosphorus, oxygen and the like may be used for n-type and, in particular, phosphorus is preferably contained. In the case of p-type, doping gas containing boron, aluminum and the like may be used and, in particular, boron (such as diborane) is preferably contained.

Next, an intermediate layer 5 of the same opposite conductivity type as that of the plasma-exposed opposite-conductivity-type layer 33 is formed thereon. More specifically, when the opposite conductivity type layer 33 is of n-type, the intermediate layer 5 is also made to be n-type, and when the opposite conductivity type layer 33 is of p-type, the intermediate layer 5 is also made to be p-type. The conductivity type intermediate layer 5 is preferably a fresh additional layer, which can act such that a good np (or pn) tunnel junction is formed between the intermediate layer 5 and a subsequent photoelectric conversion unit 4. The opposite conductivity type intermediate layer 5 is preferably deposited by plasma CVD.

The conductivity type intermediate layer 5 may be formed by adjusting deposition gas containing a new doping element after plasma exposure processing. However, the conductive intermediate layer 5 can be formed simply by performing plasma exposure processing with doping gas and hydrogen and then additionally supplying semiconductor raw gas to a reaction chamber. Here, the semiconductor raw gas may be silane for silicon, silane and methane for silicon carbide or silane and germane for a silicon-germanium alloy.

A one-conductivity type layer 41, a substantially intrinsic semiconductor amorphous or crystalline photoelectric conversion layer 42 and an opposite conductivity type layer 43 included in a second photoelectric conversion unit 4 are deposited in sequence on the opposite conductivity type intermediate layer 5 preferably by plasma CVD. Finally, a back electrode 10 is formed thereon.

The plasma exposure processing, the formation of the opposite conductivity type intermediate layer 5 and the formation of the one conductivity-type layer 41 in the second photoelectric conversion unit 4 are preferably carried out in the same decompression reaction chamber and are preferably carried out under substantially the same pressure. After the completion of the plasma exposure processing, the intermediate layer 5 can be formed continuously by additionally supplying the semiconductor raw gas such as silane to the reaction chamber immediately without stopping plasma discharging resulting from the application of high frequency electric power. In some cases, the one-conductivity type layer 41 can be further formed. In such a method, though the steps of plasma exposure processing and formation of the intermediate layer 5 are added, the addition of time and facility required for these steps can be kept at minimum.

With the method of manufacturing a tandem-type thin film photoelectric conversion device, even when the surface of the opposite-conductivity-type layer 33 of the first photoelectric conversion unit 3 is deteriorated due to the air-exposure, the surface can be cleaned or reformed by plasma exposure processing. Here, a similar effect can be expected from plasma exposure processing only in a hydrogen atmosphere without doping gas. However, plasma exposure processing with hydrogen only may adversely affect the quality of a silicon film in the vicinity of the surface to be processed. Therefore, it is believed that plasma exposure processing is preferably carried out with mixed gas of doping gas and hydrogen.

In fact, when plasma exposure processing was carried out with hydrogen only, the photoelectric conversion characteristic was slightly lower than that of the case where the first and second units 3 and 4 are formed continuously without exposure to the air. Furthermore, the reproducibility was not very high. On the other hand, when plasma processing was carried out in an atmosphere of hydrogen mixed with doping gas like the invention, almost the same photoelectric conversion characteristic was obtained as that of the continuous formation without exposure to the air.

The reason why these effects are brought about is considered that the plasma exposure with hydrogen only results in increase in resistance due to a phenomenon that a part of impurity atoms in the conductivity type layer 33 in the vicinity of the air-exposed surface is inactivated or leaves from the layer. On the other hand, it is considered that, when plasma processing is carried out with doping gas being mixed, such increase in resistance can be prevented, whereby the conductivity of the conductivity type layer 33 can be maintained. Alternatively, it is also considered that mixing of doping gas can reduce the increase in resistance because of decrease in carrier mobility of the conductivity type layer 33 due to the occurrence of defects or irregularity in the film structure resulting from a plasma damage, which is often a problem in hydrogen plasma processing.

The hydrogen plasma processing with doping gas being mixed is carried out preferably within two minutes, more preferably within one minute, through high-frequency discharging at a frequency equal to or higher than 13.56 MHz. Discharging at a lower frequency than the frequency or a longer processing time than the time may increase a side effect such as a plasma damage near the surface to be processed.

Since an increase in costs of a high frequency power supply can be prevented by setting a discharging frequency in the plasma processing to be the same as the frequency employed in the subsequent forming steps for semiconductor layers, a frequency equal to or higher than 13.56 MHz is preferably used. This is because the fact that plasma discharging at such a high frequency is preferably used for forming a high performance thin film photoelectric conversion unit is widely recognized in experimental and industrial points of view. In view of a productivity, the plasma processing time is preferably as short as possible. In order to make certain of the effect of addition of the doping gas, the concentration of the doping gas is preferably 20 ppm or more based on hydrogen.

When it becomes possible to form a plurality of photoelectric conversion units in separate plasma CVD apparatuses in this way, optimum facility specifications and forming conditions for achieving best characteristics required for the respective units can be set independently. Thus, improvement in the characteristic of the tandem-type thin film photoelectric conversion apparatus as a whole can be expected. Furthermore, since a plurality of production lines can be used for the respective units, the production efficiency and the flexibility for changes and additions of the lines can be increased. Still further, as a plurality of manufacturing apparatuses are used, maintenance thereof can be carried out one by one smoothly.

Figure 2:
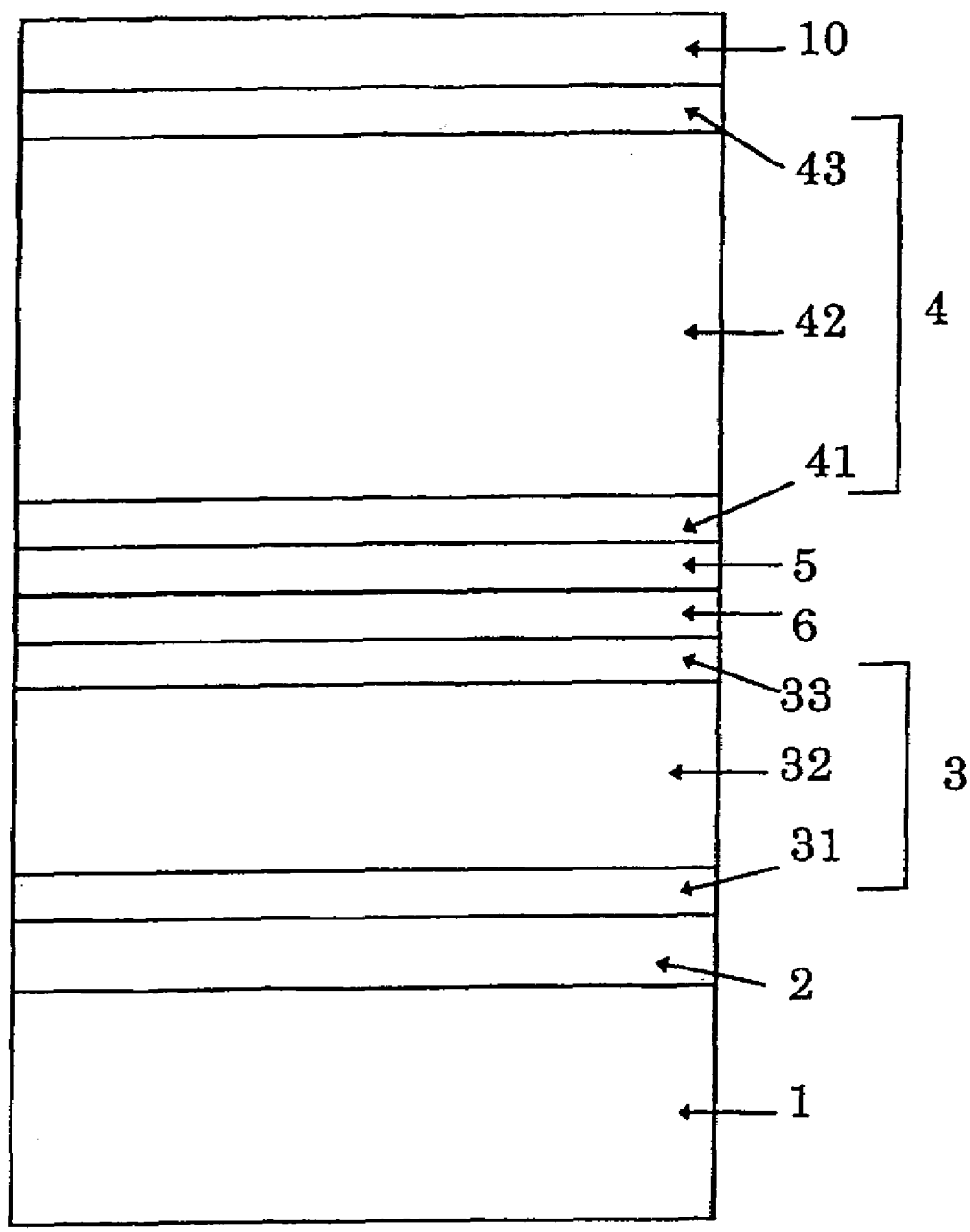
FIG. 2 is a schematic cross section diagram showing a tandem-type thin film photoelectric conversion device manufactured by a method of manufacturing according to another embodiment of the invention.

FIG. 2 shows a schematic cross section diagram of a tandem-type thin film photoelectric conversion device manufactured by a method of manufacturing according to another embodiment of the invention. The apparatus in FIG. 2 is similar to that of FIG. 1 but differs in that an additional non-doped intermediate layer 6 is formed subsequent to the deposition of the opposite conductivity type layer 33 included in the first photoelectric conversion unit 3. The non-doped intermediate layer 6 is preferably in the thickness of 5 nm or less, which may cause a tunnel effect. The non-doped intermediate layer 6 may be produced preferably by plasma CVD but may be produced by other different kinds of formation methods.

After the non-doped intermediate layer 6 is formed, the substrate 1 is taken out from the plasma CVD apparatus to the air, and the outermost surface of the non-doped intermediate layer is exposed to the air. According to the review by the inventors, the surface tends to be porous when impurity atoms (such as phosphorus for an n-type layer, especially) are doped therein like a conductivity-type layer. As the doping concentration increases, the tendency increases. Therefore, the exposure of the porous surface of the conductivity-type layer 33 according to the embodiment in FIG. 1 into the air may likely accelerate the oxidization of and/or the adhesion of a foreign substance to the porous surface as compared to the case of a flat surface.

On the other hand, as compared to the conductivity-type layer, the surface of the non-doped intermediate layer 6 may not likely be deteriorated or contaminated when the non-doped intermediate layer is exposed to the air. The non-doped intermediate layer 6 does not inhibit current flow because it causes a tunnel effect when its thickness is 5 nm or less, therefore, the non-doped intermediate layer 6 is less apt to be a factor that causes decrease in the electric characteristic as an photoelectric conversion device.

After the surface of the non-doped intermediate layer 6 is exposed to the air, hydrogen plasma exposure processing with doping gas being mixed is carried out on the non-doped intermediate layer 6 also in the case in FIG. 2 like the case in FIG. 1. Subsequently, the opposite-conductivity type intermediate layer 5 and the second photoelectric conversion unit 4 are formed by plasma CVD.

The opposite-conductivity type intermediate layer 5 is formed in both of the embodiments in FIGS. 1 and 2. Since the opposite-conductivity type intermediate layer 5 can also act to support the function of the opposite-conductivity type layer 33 of the first photoelectric conversion unit 3, the opposite conductivity type intermediate layer 5 may be considered as a part of the opposite conductivity type layer 33. Since the one-conductivity type layer 41 of the second photoelectric conversion unit 4 is formed continuously on the opposite conductivity type intermediate layer 5 without exposing the opposite conductivity type intermediate layer 5 to the air, it is expected that a good np (or pn) tunnel junction, which is desirable for achieving a high photoelectric conversion characteristic in the tandem-type photoelectric conversion device, is formed.

The photoelectric conversion devices according to these embodiments may have a so-called super-straight structure having the back electrode 10 on the two photoelectric conversion units 3 and 4 including semiconductor layers in the pin order stacked on the glass substrate 1. Alternatively, the photoelectric conversion devices may have a so-called sub-straight structure having the transparent electrode 10 on a multiple of the units 3 and 4 formed on an arbitrary substrate 1, for example. Furthermore, the invention is not limited to two-stack type tandem-type structure in which the two photoelectric conversion units 3 and 4 are stacked and may be applicable to a tandem-type structure in which three or more photoelectric conversion units are stacked.

As an example of a method of manufacturing a tandem-type thin film photoelectric conversion device according to the embodiments in FIGS. 1 and 2, a method of manufacturing a hybrid thin film solar cell having a two-stack type super straight structure including the amorphous silicon unit 3 and the crystalline silicon unit 4 will be described below with reference to a reference example and comparative examples.

EXAMPLE 1

Example 1 corresponds to a method of manufacturing a thin film solar cell in FIG. 2. First of all, a transparent electrode layer 2 containing tin oxide as a main component was formed on a transparent glass substrate 1. Then, the laminate including the substrate 1 and the electrode layer 2 was introduced in a first plasma CVD apparatus, and a p-type amorphous silicon carbide layer 31, an i-type amorphous silicon photoelectric conversion layer 32 and an n-type microcrystalline silicon layer 33 included in an amorphous silicon unit 3 were formed in the thickness of 8 nm, 300 nm and 10 nm, respectively, at a predetermined substrate temperature. After the formation of the n-type layer 33, introduction of phosphine as doping gas was shut off in the same reaction chamber, and a non-doped intermediate layer 6 was formed in the thickness of 4 nm.

After that, the laminate was transferred to an unload chamber of the first plasma CVD apparatus, and the laminate was taken out to the air after the camber was promptly filled with nitrogen gas. The laminate was left in the air for about 40 hours and then was introduced into a second plasma CVD apparatus.

In the second plasma CVD apparatus, plasma exposure processing was carried out at a predetermined substrate temperature for 20 seconds in an atmosphere in which hydrogen and phosphine gas were mixed. The concentration of the phosphine gas to hydrogen at that time was 200 ppm. Subsequently, silane gas was additionally introduced into the same chamber under substantially the same pressure condition while plasma discharging by application of high frequency electric power was continued whereby an n-type microcrystalline silicon intermediate layer 5 was deposited in the thickness of 20 nm in a mixed atmosphere of silane, hydrogen and phosphine.

After that, high frequency electric power was shut off once. Then, in the same chamber under substantially the same pressure condition, introduction of phosphine gas was stopped and diborane gas was introduced into the chamber. Then, it was held for about 30 seconds until silane, hydrogen and diborane became stable as a mixed gas atmosphere. Then, high frequency power was applied thereto to cause plasma discharging to deposit a p-type microcrystalline silicon layer 41 included in the crystalline silicon unit in the thickness of 16 nm. Table 1 shows detail conditions in the second plasma CVD apparatus for the steps so far.

TABLE 1

| | Substrate Temperature (° C.) | Discharging Frequency (MHZ) | Power Density (W/cm$^2$) | Pressure (Pa) | Flow Rate (Relative Value) | | | | PH$_3$/H$_2$ (ppm) |
| | | | | | SiH$_4$ | H$_2$ | B$_2$H$_6$ | PH$_3$ | |
|---|---|---|---|---|---|---|---|---|---|
| Plasma Processing | 160 | 27.12 | 0.30 | 350 | 0 | 125 | 0 | 0.025 | 200 |

TABLE 1-continued

|  | Substrate Temperature (° C.) | Discharging Frequency (MHZ) | Power Density (W/cm$^2$) | Pressure (Pa) | Flow Rate (Relative Value) | | | | PH$_3$/H$_2$ (ppm) |
|---|---|---|---|---|---|---|---|---|---|
|  |  |  |  |  | SiH$_4$ | H$_2$ | B$_2$H$_6$ | PH$_3$ |  |
| n-Type Layer 5 | 160 | 27.12 | 0.30 | 350 | 1 | 125 | 0 | 0.025 | — |
| p-Type Layer 41 | 160 | 27.12 | 0.30 | 350 | 1 | 125 | 0.0025 | 0 | — |

As is apparent from Table 1, plasma exposure processing in an atmosphere of a gas mixture containing phosphine and hydrogen, the formation of the n-type intermediate layer 5 and the formation of the p-type layer 41 were continuously carried out in the same chamber under the same set pressure. Furthermore, in Example 1, the discharging frequencies, the applied power densities, the substrate temperatures and the gas flow rates were set uniformly, so that a series of processes and deposition steps can be carried out quickly through simple manipulations of opening/closing of valves of a gas introducing lines and turning on/off of plasma discharging.

A transient change may occur in the pressure in the chamber with the introduction or shut-off of the doping gas or the semiconductor raw gas. However, the flow rates of these gases are lower than that of the continuously introduced hydrogen gas by about two orders or more of magnitude. Thus, the transient change in pressure can be significantly small. Therefore, the waiting time (time for stabilizing pressure and a gas mixture ratio) before the deposition of the n-type intermediate layer 5 and the p-type layer 41 can be as short as about 30 seconds in total. In other words, the addition of the plasma exposure processing and the step of forming the n-type intermediate layer 5 hardly cause a time loss in the process for manufacturing a solar cell.

After the formation of the p-type layer 41, a non-doped i-type crystalline silicon photoelectric conversion layer 42 and an n-type microcrystalline silicon layer 43 included in the crystalline silicon unit 4 were formed in the thickness of 1.7 μm and 15 nm, respectively, in the second plasma CVD apparatus. Then, the laminate was transferred to the unload chamber of the second plasma CVD apparatus, and the chamber was filled with nitrogen gas promptly. Then, the laminate was taken out to the air.

Then, a zinc oxide film having a thickness of 30 nm, a silver film having a thickness of 240 nm a titan film having a thickness of 5 nm included in a back electrode 10 were formed by sputtering. Through these film forming steps, the two-stack type hybrid-type thin film solar cell as shown in FIG. 2 in which the amorphous silicon unit 3 and the crystalline silicon unit 4 are stacked was formed.

By using a solar simulator, light of AM 1.5 spectrum was irradiated to the hybrid thin film solar cell of Example 1 at energy density of 1 kW/m$^2$ at 25 ° C., and the photoelectric conversion efficiency was measured. Relative values of the result are shown in Table 2. Though Table 2 includes examples other than Example 1, maximum values, minimum values and mean values of photoelectric conversion efficiencies of 20 samples (N=20) are shown for all cases. The values are standardized by referring the mean value of Example 1 to be 100.

TABLE 2

|  | Maximum Value | Minimum Value | Average Value at N = 20 |
|---|---|---|---|
| Example 1 | 101.4 | 97.4 | 100.0 |
| Example 2 | 100.4 | 96.0 | 99.1 |
| Reference Example | 102.7 | 98.7 | 101.0 |
| Comparative Example 1 | 98.6 | 90.1 | 95.6 |
| Comparative Example 2 | 100.8 | 93.4 | 97.7 |
| Example 3 | 101.1 | 96.6 | 99.3 |
| Comparative Example 3 | 100.5 | 93.9 | 97.8 |
| Example 4 | 101.3 | 96.5 | 99.5 |
| Comparative Example 4 | 98.9 | 93.5 | 97.2 |

EXAMPLE 2

Example 2 was different from Example 1 only in that the thickness of the n-type microcrystalline silicon layer 33 in the amorphous silicon unit 3 was increased from 10 nm to 12 nm, and thereafter the laminate was taken out from the first plasma CVD apparatus to the air without formation of the non-doped intermediate layer 6. In other words, Example 2 corresponds to a method of manufacturing a hybrid thin film solar cell in FIG. 1.

REFERENCE EXAMPLE

Reference Example was different from Example 2 only in that the thickness of the n-type microcrystalline silicon layer 33 was increased to 30 nm and the crystalline silicon unit 4 was subsequently formed without exposure of the laminate to the air and also without formation of the n-type intermediate layer 5.

As shown in Table 2, it is understood that the decreases in the average photoelectric conversion efficiency of the solar cells according to both of Example 1 and Example 2 fall within the range of less than 2% in comparison with the solar cell according to Reference Example, which was formed without exposure to the air, and the variations in conversion efficiency of the solar cells according to Example 1 and 2 are almost the same as that of Reference Example. It is also understood that Example 1 in which the non-doped intermediate layer 6 was formed has a slightly higher conversion efficiency than that of Example 2.

Figure 3:
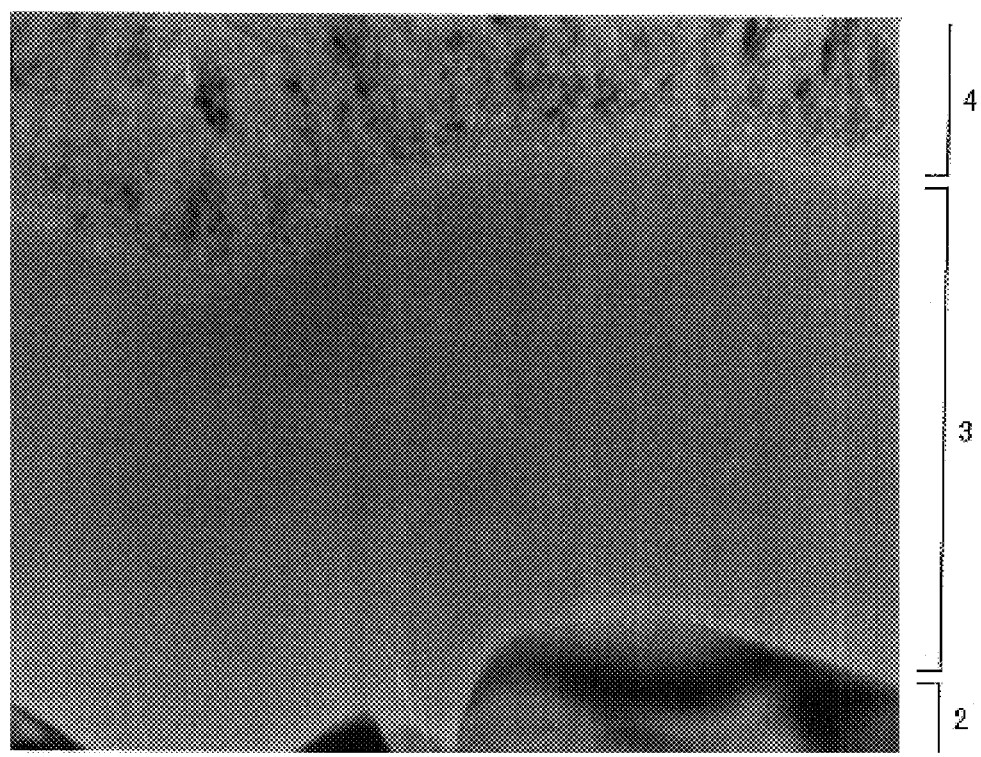
FIG. 3 is a transmission electron microscopic (TEM) photograph showing a cross section structure in the vicinity of a boundary between an amorphous unit and a crystalline unit in a hybrid-type thin film photoelectric conversion device according to Example 1 of the invention.

FIG. 3 is a transmission electron microscopic (TEM) photograph showing a cross section of a part in the vicinity of the boundary between the amorphous unit 3 and crystalline unit 4 in Example 1. The transparent electrode 2 partially appears at the bottom of the photograph. When an oxide film or contaminated layer is formed on the non-doped intermediate layer 6, which was exposed to the air, such a foreign substance layer may be clearly observed on a TEM photograph. However, on the TEM photograph in FIG. 3, a clear foreign substance layer is not observed between the amorphous unit 3 and the crystalline unit 4. Only the change from the amorphous state to the crystalline state can be observed.

Figure 4:
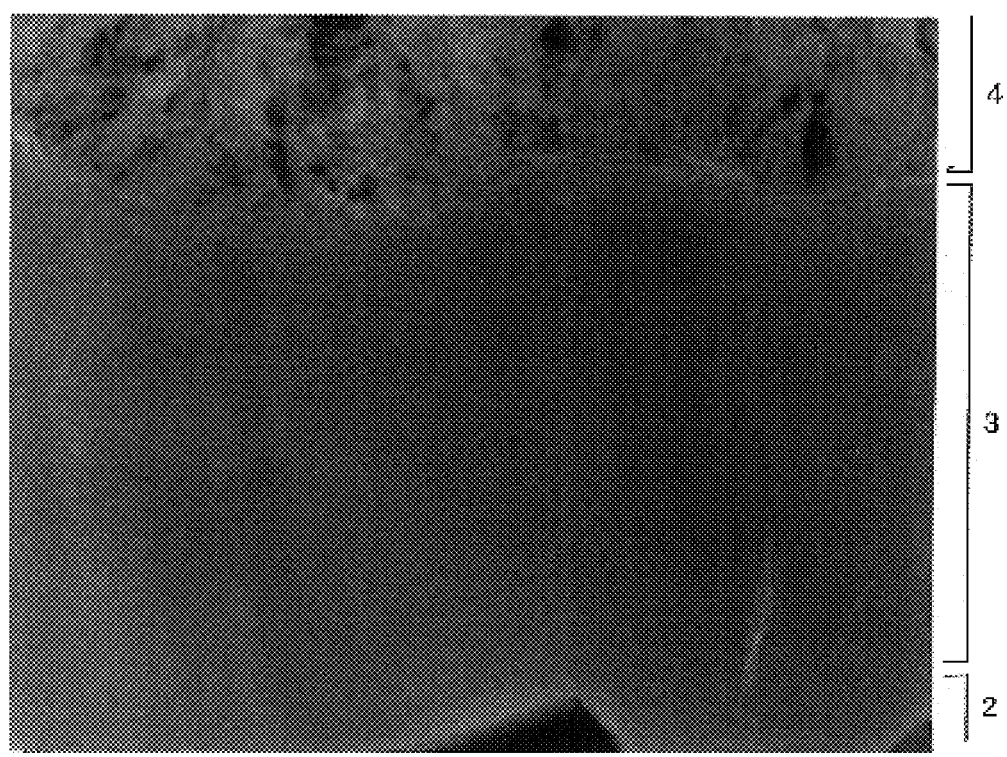
FIG. 4 is a TEM photograph showing a cross section structure in the vicinity of a boundary between an amorphous unit and a crystalline unit in a hybrid-type thin film photoelectric conversion device according to Reference Example.

Similarly, FIG. 4 is a TEM photograph showing a cross section of a part in the vicinity of the boundary between the amorphous unit 3 and the crystalline unit 4 in Reference Example. Since the laminate was not exposed to the air between the formation of the amorphous silicon unit 3 and the crystalline unit 4 in Reference Example, no foreign substance layer can be observed between the amorphous unit 3 and the crystalline unit 4 on the TEM photograph in FIG. 4 as a matter of course. Only the change from the amorphous state to the crystalline state can be observed.

From the similarity between the FIG. 3 and FIG. 4 as described above, even when the surface of the non-doped intermediate layer 6 was exposed to the air and thereby it was oxidized or contaminated in Example 1, the plasma exposure processing in the second plasma CVD apparatus might remove and clean a foreign substance layer such as an oxidized film or a contamination film. In other words, the plasma exposure processing can provide the same effect as that of the case in which the laminate was not exposed into the air between the formation step of the amorphous unit 3 and the formation step of the crystalline unit 4.

COMPARATIVE EXAMPLE 1

Comparative Example 1 was different from Example 1 only in that plasma exposure processing on a surface of the laminate was omitted in the second plasma CVD apparatus.

COMPARATIVE EXAMPLE 2

Comparative Example 2 was different from Example 1 only in that plasma exposure processing was carried out on a surface of the laminate in an atmosphere of hydrogen gas only in the second plasma CVD apparatus, and then silane gas and phosphine gas were additionally introduced so that the n-type microcrystalline silicon intermediate layer 5 was formed.

According to Table 2, the average conversion efficiency in the case in which plasma exposure processing was not carried out as in Comparative Example 1 is lower than that of Example 1 by 4% or above. On the other hand, though the conversion efficiency improved slightly when plasma exposure process with hydrogen only was carried out as in Comparative Example 2, a large variation in the conversion efficiency was exhibited, and the average efficiency was apparently lower than that of Example 1.

EXAMPLE 3 AND COMPARATIVE EXAMPLE 3

Example 3 and Comparative Example 3 were different from Example 1 only in that the concentration of phosphine to hydrogen was 20 ppm (example 3) and 4 ppm (Comparative Example 3), which are 1/10 and 1/50, respectively, of that of Example 1, in plasma exposure processing carried out on the surface of the laminate in the mixed atmosphere of phosphine and hydrogen. From Table 2, the conversion efficiency of Comparative Example 3 in which 4 ppm phosphine was added at plasma exposure processing is not much different from that of Comparative Example 2 in which no phosphine was added. However, the conversion efficiency of Example 3 in which 20 ppm phosphine was added exhibits that the phosphine in the concentration is sufficiently effective.

EXAMPLE 4 AND COMPARATIVE EXAMPLE 4

Example 4 and Comparative Example 4 were different from Example 1 only in that the processing time of plasma exposure processing carried out on a surface of the laminate in an atmosphere of a gas mixture of phosphine and hydrogen gas was 60 seconds (Example 4) and 180 seconds (Comparative Example 4), which are 3 times and 9 times, respectively, of those of Example 1. From Table 2, the effects are not much different even when the plasma exposure processing time is increased from 20 seconds in Example 1 to 60 seconds in Example 4. However, the conversion efficiency adversely decreases when the processing time was extended to 180 seconds in Comparative example 4.

INDUSTRIAL APPLICABILITY

As described above, according to the present invention, when the substrate having one or more units is once taken out from the deposition apparatus to the air in mid-course of the formation of the plurality of photoelectric conversion units included in the tandem-type thin film photoelectric conversion device, the reduction in photoelectric conversion efficiency of the completed apparatus due to the air exposure can be minimized. Thus, the photoelectric conversion units can be formed discontinuously by using separate deposition apparatuses, and the flexibility and production efficiency of steps of manufacturing a tandem-type thin film photoelectric conversion device can be improved.

The invention claimed is:

1. A method of manufacturing a tandem-type thin film photoelectric conversion device comprising the steps of:

forming at least one photoelectric conversion unit through sequentially stacking a first one-conductivity type layer, a first photoelectric conversion layer of substantially intrinsic semiconductor and a first opposite-conductivity type layer on a substrate in a deposition apparatus;

taking out the substrate having the photoelectric conversion unit from the deposition apparatus to air, wherein a non-doped intermediate layer having a thickness of 5 nm or less is formed subsequently to the step of forming the at least one photoelectric conversion unit on the substrate and then the substrate is taken out to the air;

introducing the substrate into a deposition apparatus and carrying out plasma exposure processing on the substrate in an atmosphere of a gas mixture containing an impurity element for determining the conductivity type of the same conductivity type as that of the first opposite-conductivity type layer and hydrogen;

forming a conductivity type intermediate layer by additionally supplying semiconductor raw gas to the deposition apparatus; and then forming a subsequent photoelectric conversion unit through sequentially stacking a second one-conductivity type layer, a second photoelectric conversion layer of substantially intrinsic semiconductor and a second opposite-conductivity type layer.

2. A method of manufacturing a tandem-type thin film photoelectric conversion device according to claim 1, characterized in that the tandem-type thin film photoelectric conversion device includes at least one amorphous silicon thin film photoelectric conversion unit and at least one crystalline silicon thin film photoelectric conversion unit.

3. A method of manufacturing a tandem-type thin film photoelectric conversion device according to claim 1, characterized in that the plasma exposure processing and the formation of the conductivity-type intermediate layer are carried out in the same deposition apparatus.

4. A method of manufacturing a tandem-type thin film photoelectric conversion device according to claim 1, characterized in that the plasma exposure processing and the formation of the conductivity-type intermediate layer are carried out under substantially the same pressure.

* * * * *